US012772772B2

(12) United States Patent
Gao et al.

(10) Patent No.: US 12,772,772 B2
(45) Date of Patent: Oct. 20, 2026

(54) MITIGATION OF FIRST WAFER EFFECT

(71) Applicant: Applied Materials, Inc., Santa Clara, CA (US)

(72) Inventors: Yongqian Gao, Sunnyvale, CA (US); Michael S. Jackson, Sunnyvale, CA (US); David T. Or, Santa Clara, CA (US); Chun-Chieh Wang, Sunnyvale, CA (US); Le Zhang, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 259 days.

(21) Appl. No.: 18/660,774

(22) Filed: May 10, 2024

(65) Prior Publication Data

US 2024/0379343 A1 Nov. 14, 2024

Related U.S. Application Data

(60) Provisional application No. 63/563,039, filed on Mar. 8, 2024, provisional application No. 63/466,069, filed on May 12, 2023.

(51) Int. Cl.
*H10P 70/00* (2026.01)
*H01J 37/32* (2006.01)

(52) U.S. Cl.
CPC ............ *H10P 70/20* (2026.01); *H01J 37/321* (2013.01); *H01J 37/32357* (2013.01); *H01J 37/32862* (2013.01); *H01J 2237/334* (2013.01)

(58) Field of Classification Search
CPC ...... H10P 70/20; H10P 50/242; H01J 37/321; H01J 37/32357; H01J 37/32862; H01J 2237/334
USPC .................................................. 438/714–725
See application file for complete search history.

(56) References Cited

U.S. PATENT DOCUMENTS

| | | | | |
|---|---|---|---|---|
| 2004/0171261 | A1* | 9/2004 | Song | H10D 64/021 438/692 |
| 2007/0215180 | A1* | 9/2007 | Iijima | H10P 72/0406 134/18 |
| 2010/0006539 | A1 | 1/2010 | Yang et al. | |
| 2010/0071719 | A1 | 3/2010 | Lin et al. | |
| 2010/0093151 | A1 | 4/2010 | Arghavani et al. | |
| 2019/0382889 | A1* | 12/2019 | Parimi | C23C 16/4405 |
| 2020/0194242 | A1* | 6/2020 | Zhou | H01J 37/32862 |

(Continued)

FOREIGN PATENT DOCUMENTS

| | | | | |
|---|---|---|---|---|
| CN | 104347417 A | * | 2/2015 | H10W 20/0698 |
| CN | 108847389 A | | 11/2018 | |
| KR | 20150011117 A | * | 1/2015 | B08B 7/0064 |

(Continued)

OTHER PUBLICATIONS

PCT International Search Report and Written Opinion in PCT/US2024/028366 dated Aug. 30, 2024, 9 pages.

*Primary Examiner* — Duy Vu N Deo
(74) *Attorney, Agent, or Firm* — Servilla Whitney LLC

(57) ABSTRACT

Embodiments of the disclosure relate to methods for reducing or eliminating the first wafer effect after chamber cleans for plasma etch processes. In some embodiments, the wafer support is maintained at an elevated temperature relative to the etch process. In some embodiments, the etch process is a $NF_3$+$NH_3$ plasma etch to remove native oxides from a silicon substrate.

17 Claims, 3 Drawing Sheets

(56) References Cited

U.S. PATENT DOCUMENTS

| | | | | |
|---|---|---|---|---|
| 2020/0321200 | A1 | 10/2020 | Kudo et al. | |
| 2024/0355673 | A1 * | 10/2024 | Lei | H10P 14/432 |

FOREIGN PATENT DOCUMENTS

| | | | | | |
|---|---|---|---|---|---|
| KR | 20210104638 | A | | 8/2021 | |
| KR | 20220131955 | A | * | 9/2022 | H01J 37/3299 |
| TW | 1314343 | B | * | 9/2009 | C23C 16/4405 |
| WO | 2022231732 | A1 | | 11/2022 | |

* cited by examiner

MITIGATION OF FIRST WAFER EFFECT

CROSS-REFERENCE TO RELATED APPLICATIONS

This application claims priority to U.S. Provisional Application No. 63/466,069, filed May 12, 2023, and U.S. Provisional Application No. 63/563,039, filed Mar. 8, 2024, the entire disclosures of which are hereby incorporated by reference herein.

TECHNICAL FIELD

Embodiments of the disclosure generally relate to plasma etching and cleaning processes. In particular, embodiments of the disclosure relate to methods for reducing the first wafer effect after cleaning a plasma etch chamber. Embodiments of the disclosure further relate to a burn-in process employed in a plasma etch chamber.

BACKGROUND

In the manufacture of integrated circuits, various materials such as silicon dioxide, silicon nitride, polysilicon, metal silicide, and monocrystalline silicon on a substrate, are etched in predefined patterns to form gates, vias, contact holes, trenches, and/or interconnect lines. In the etching process, a patterned mask layer composed of oxide or nitride hard mask or photoresist, may be formed on the substrate and exposed portions of the substrate between the patterned mask are etched by capacitive or inductively coupled plasmas of etchant gases. During the etch processes, etch residues accumulate within the processing chamber, and a thin etch residue deposits on the walls and other component surfaces inside the etching chamber. The composition of the etch residues typically varies considerably across the chamber surface depending upon factors such as the composition of the localized gaseous environment, the location of gas inlet and exhaust ports, and the chamber geometry.

While a small quantity of these residues is required for a stable process, as multiple wafers are processed, the residues must be removed periodically to prevent defects and process instability.

Typically, after processing a number of wafers (e.g., about 25 wafers), an in-situ plasma "dry-clean" process is performed in an empty etching chamber to clean the chamber. However, the energetic plasma species rapidly erode the chamber walls and chamber components, and it is expensive to replace these parts and components. Also, erosion of the chamber surfaces can result in instability of the etching process from one water to another. Because it is difficult to form a cleaning plasma that uniformly etches away the compositional variants of etch residue, after cleaning about 100 or 300 wafers, the etching chamber is opened to the atmosphere and cleaned in a "wet-cleaning" process, in which an acid or solvent is used to scrub off and dissolve accumulated etch residue on the chamber walls.

While current chamber clean methods suitably restore the chamber, they produce a first wafer effect on subsequently processed wafers. Most notably, the etch amount seen on the first wafer is noticeably less than subsequently processed wafers, known as the "first wafer effect". These under-processed wafers often lead to defective chips and circuits.

To remedy this effect, some current recipes resort to cleaning the chamber after each wafer. In so doing, every wafer is equally affected by the first wafer effect. Unfortunately, this solution significantly increases processing time and decreases throughput.

Another approach to address the "first wafer effect" in wafer etch processes is by a "seasoning" or "burn-in" process which runs an appropriate etch chemistry on a dummy wafer prior to etching a production wafer. For example, after a wet cleaning step or after the chamber is idle, a chamber can be seasoned/subjected to a burn-in process to deposit a layer (e.g., a silicon oxide layer) over the chamber walls before introducing a wafer for processing. The deposited layer can reduce the likelihood that contaminants will negatively impact subsequent steps on the substrate. However, current seasoning/burn-in methods involve numerous cycles and have a low duty cycle for actual burn-in.

Accordingly, there is a need for improved methods to reduce or eliminate the first wafer effect.

SUMMARY

One or more embodiments of the disclosure are directed to an etching method comprising individually exposing a plurality of wafers to a plasma etching environment at a first temperature in a plasma etch chamber without cleaning or conditioning the chamber between wafers; and cleaning the chamber in the absence of a wafer while maintaining a wafer support within the chamber at a second temperature greater than the first temperature. The method reduces a decrease in etching efficiency for the first wafer processed after cleaning the plasma etch chamber.

Additional embodiments of the disclosure are directed to a method of etching a plurality of wafers. The method comprises etching a first set of at least two silicon wafers within a plasma etch chamber. Each silicon wafer has a native oxide on an exposed surface of the silicon wafer and is individually exposed to an etching plasma environment at a first temperature in a range of 20° C. to 40° C., then heated to a third temperature greater than or equal to 85° C. to remove the native oxide. The etching plasma environment is formed from a plasma gas comprising $NF_3$ and $NH_3$. The chamber is cleaned by exposing a chamber process kit and a wafer support to a cleaning plasma comprising Ar and $O_2$, then a remote etching plasma comprising $NF_3$ and $NH_3$ and then a treatment plasma comprising $NH_3$, in the absence of a wafer. The wafer support is maintained at a second temperature greater than or equal to 85° C., and the chamber is only cleaned after etching the at least two wafers. The etching and the cleaning are repeated with a second set of at least two wafers. The method reduces a decrease in etching efficiency for the first wafer processed after cleaning the plasma etch chamber.

Additional embodiments of the disclosure are directed to methods and apparatus for reducing burn-in time of a semiconductor processing chamber. In some embodiments, a method is provided for reducing burn-in time of a plasma etch chamber by maintaining a wafer support at a heightened temperature while continuously flowing a remote plasma gas into the chamber. The method causes the etchant to primarily be absorbed by the chamber walls rather than on a dummy wafer positioned in the chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers and other material used by adjacent industries which use fabrication processes similar to those commonly found in the semiconductor industry.

Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates.

One or more embodiment of the disclosure relates to an etching method. More specifically, one or more embodiment of the disclosure relates to etching a series of wafers and periodically cleaning the etching chamber. In some embodiments, the methods advantageously reduce or eliminate the first wafer effect of reduced etching seen on the first wafer after a chamber clean. One or more embodiment of the disclosure further relates to etching a series of wafers and periodically performing a burn-in process. In some embodiments, the burn-in method is designed so that the etchant is primarily absorbed by the chamber walls rather than the wafer, thus reducing the burn-in time and resources used in the method.

Figure 1:
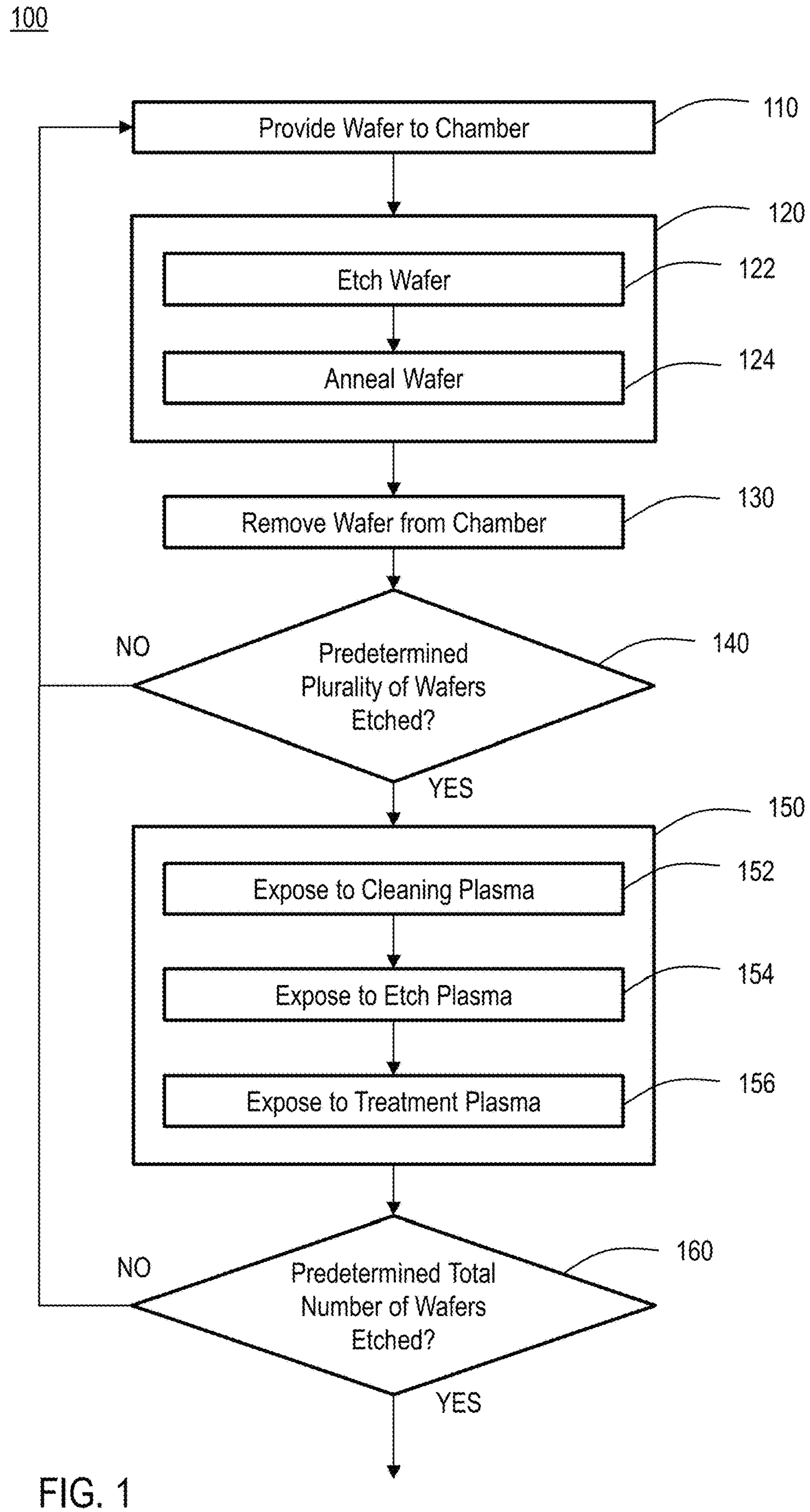
FIG. 1 illustrates a flow chart of an etching method in accordance with one or more embodiments of the disclosure.

With reference to FIG. 1, a method 100 is disclosed to etch a plurality of wafers and clean a plasma etch chamber. The method 100 begins at operation 110 by providing a wafer to a plasma etch chamber. As used in this manner, "providing a wafer", and the like, means positioning a wafer within the processing environment and may include one or more of loading the wafer into the processing environment, positioning the wafer on a pedestal/heater in the processing environment, heating the wafer to a process temperature, etc. In some embodiments, the wafer comprises a silicon substrate. In some embodiments, the wafer contains a layer of native oxide (e.g., silicon oxide) on the surface of the wafer.

At operation 120, the wafer undergoes an etch process 122. During etch process 122 the wafer is exposed to a plasma etching environment while being maintained at a first temperature $T_1$. In some embodiments, the first temperature $T_1$ is in a range of 0° C. to 60° C., or in the range of 10° C. to 50° C., or in the range of 20° C. to 40° C. In some embodiments, the first temperature $T_1$ is about 30° C.

In some embodiments, the plasma etching environment comprises a plasma of $NF_3$ and $NH_3$. The plasma of some embodiments further comprises one or more carrier, diluent or inert gases, including, but not limited, a co-flow of helium (He), hydrogen ($H_2$) or argon (Ar). In some embodiments, the plasma is generated remotely and flows into the etching environment. In some embodiments, the plasma is a direct, inductively coupled plasma (ICP) or capacitively coupled plasma (CCP). In some embodiments, the plasma is an ICP formed using a low power in a range of 100 W to 2000 W, or in a range of 200 W to 1500 W.

Without being bound by theory, it is believed that, in some embodiments, the plasma etching environment reacts with layer of native oxide to form an etch residue and gaseous byproducts. In some embodiments, the etch residue comprises $(NH_4)_2SiF_6$. In some embodiments, the gaseous byproducts comprise ammonia and/or water.

In some embodiments, operation 120 continues at anneal 124 by optionally heating the wafer to remove etch residue. In these embodiments, the wafer is heated to a third temperature $T_3$. The use of ordinals (e.g., first, second, third) is intended to distinguish between different components or process conditions, and should not be taken as implying a particular order of operation, unless the context clearly indicates so. In some embodiments, the third temperature $T_3$ is greater than or equal to 80° C., greater than or equal to 85° C., greater than or equal to 90° C., or greater than or equal to 100° C. Without being bound by theory, it is believed that the elevated third temperature sublimates the etch residue to facilitate its removal by the chamber vacuum.

At operation 130, the wafer is removed from the plasma etch chamber. The wafer can be removed by any suitable techniques known to the skilled artisan including, but not limited to, removal by an automated wafer handling system (i.e., a robot).

The method 100 continues to decision point 140. At decision point 140, it is determined whether a predetermined plurality of wafers have been etched. If not, the method returns to operation 110 to begin etching another wafer. If the predetermined number of wafers has been etched, the method 100 continues to operation 150, a chamber cleaning process. In some embodiments, the predetermined plurality of wafers comprises greater than or equal to 2 wafers, greater than or equal to 5 wafers, greater than or equal to 10 wafers, greater than or equal to 20 wafers, greater than or equal to 25 wafers, greater than or equal to 50 wafers greater than or equal to 75 wafers, or greater than or equal to 100 wafers.

At operation 150, the plasma etch chamber is cleaned. It should be noted that because the wafer is removed from the etching environment at operation 130, operation 150 is necessarily performed without a wafer present in the plasma etch chamber.

Without being bound by theory, the chamber process kit and the wafer support may accumulate deposited etch residue and/or condensed gaseous byproducts during etch process 122 and/or anneal 124. As these materials may interfere with the continued operation or longevity of the chamber, it is advantageous to remove the residues, including any new materials formed by reactions therebetween, by operation 150.

Operation 150 begins with exposure to a cleaning plasma at cleaning 152. In some embodiments, the cleaning plasma of cleaning 152 comprises argon and oxygen ($O_2$). In some embodiments, the cleaning plasma 152 consists essentially of argon and oxygen ($O_2$). As used in this specification and the appended claims, the term "consists essentially of" means that the composition of the reactive component(s) or gases is greater than or equal to 95%, 98%, 99% or 99.5% of the stated composition. The additional of inert, diluent or carrier gases is not taken into consideration in this calculation. In some embodiments, the cleaning plasma is generated remotely and flowed into the process region of the chamber. In some embodiments, the cleaning plasma is generated remotely, or in-situ.

Without being bound by theory, it is believed that the cleaning plasma comprising argon and oxygen is effective to oxidize any foreign materials on the surfaces of the chamber process kit (e.g., edge ring, purge ring, plasma shield, etc.) and/or wafer support.

In some embodiments, operation 150 continues by exposure to an etch plasma at etching 154. In some embodiments, the etch plasma at etching 154 is formed from the same plasma gases and parameters (power, etc.) as the plasma etching environment at etch process 122. In some embodiments, the etch plasma at etching 154 comprises $NF_3$ and $NH_3$. In some embodiments, the etch plasma at etching 154 consists essentially of $NF_3$ and $NH_3$. In some embodiments, the etch plasma is generated remotely and flowed into the process region of the chamber. In some embodiments, the plasma is a direct, inductively coupled plasma (ICP) or conductively coupled plasma (CCP). In some embodiments, the plasma is an ICP formed using a low power in a range of 100 W to 2000 W, or in a range of 200 W to 1500 W.

Without being bound by theory, it is believed that the etch plasma at etching 154 is effective to remove any foreign materials, particularly those oxidized by the cleaning plasma at cleaning 152.

Operation 150 may continue by exposure to a treatment plasma at treating 156. In some embodiments, the treatment plasma at treating 156 is formed from ammonia. In some embodiments, the treatment plasma at treating 156 consists essentially of ammonia. In some embodiments, the treatment plasma is generated remotely and flowed into the process region of the chamber. In some embodiments, the plasma is generated with a power in a range of 500 W to 1500 W, or in a range of 1000 W to 1500 W.

The inventors have surprisingly found that the treatment plasma at treating 156 reduces the number of defects in processed wafers. These defects were particularly pronounced near the wafer edge.

Further, the inventors have found that by increasing the wafer support temperature to a second temperature $T_2$ during operation 150, the first wafer effect can be reduced or eliminated. For example, when the wafer support is maintained at a temperature of about 30° C. (similar to the first temperature $T_1$) during operation 150, operation 150 leads to a reduction in the etch amount seen on the next processed wafer (referred to as a first wafer effect). However, when the wafer support is maintained at an elevated second temperature, the first wafer effect is not seen. In some embodiments, the second temperature is in a range of 40° C. to 100° C. In some embodiments, the second temperature is 90° C. In some embodiments, the second temperature is greater than or equal to 40° C., greater than or equal to 60° C., greater than or equal to 80° C., or greater than or equal to 100° C.

In some embodiments, the temperature of the wafer support can be raised by moving the wafer support closer to a heated showerhead during operation 150. In some embodiments, the temperature of the wafer support can be raised by providing a dual zone wafer support configured to supply step-to-step temperature control. Thus, in some embodiments, the temperature of the wafer support can be raised by maintaining the height of the wafer support while tuning the dual zone heaters.

After operation 150, the method 100 continues to decision point 160. At decision point 160, it is determined whether a predetermined total number of wafers have been etched. If not, the method returns to operation 110 to etch another wafer. If the predetermined number of wafers have been etched, the method 100 may end or move to other processes.

According to some embodiments, after operation 150, the method can alternatively continue to a burn-in process. In some embodiments, the burn-in process comprises a sublimation mode in which the wafer support is maintained at an elevated burn-in temperature while continuously flowing a suitable gas into the chamber. In some embodiments, the burn-in temperature is in a range of about 40° C. to about 100° C. In some embodiments, the burn-in temperature is greater than or equal to about 40° C., greater than or equal to about 45° C., greater than or equal to about 50° C., greater than or equal to about 55° C., greater than or equal to about 60° C., greater than or equal to about 65° C., greater than or equal to about 70° C., greater than or equal to about 75° C., greater than or equal to about 80° C., greater than or equal to about 85° C., greater than or equal to about 90° C., greater than or equal to about 95° C., or greater than or equal to about 100° C. The inventors have found that by using an elevated wafer support temperature and a continuous gas flow during a burn-in process, the etchant primarily absorbs on the chamber walls rather than on the wafer support or dummy wafer, thus reducing the burn-in time. The inventors have further found that by using an elevated wafer support temperature and a continuous gas flow during a burn-in process, any remaining first wafer effect can be further reduced or eliminated.

Figure 2:
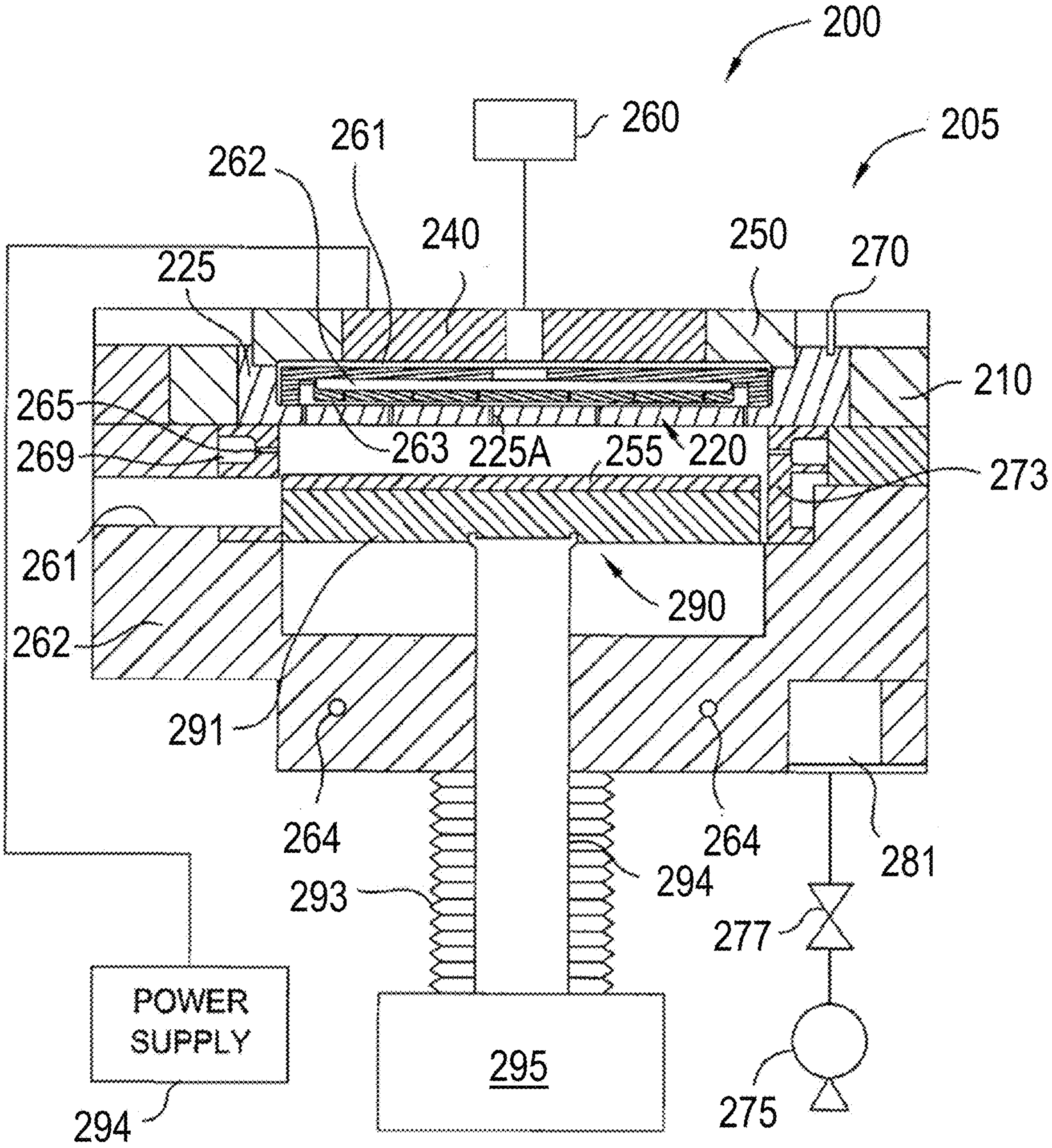
FIG. 2 illustrates a cross-sectional view of a plasma processing chamber in accordance with one or more embodiments of the disclosure.

FIG. 2 schematically illustrates a sectional view of a processing chamber 200 in accordance with one embodiment of the present invention. In the illustrated embodiment, the processing chamber 200 includes a lid assembly 205 disposed at an upper end of a chamber body 262, and a support assembly 290 at least partially disposed within the chamber body 262. The processing chamber 200 also includes a remote plasma generator 260 having a remote electrode with a U-shaped cross section (not shown). The processing chamber 200 and the associated hardware are preferably formed from one or more process-compatible materials, for example, aluminum, anodized aluminum, nickel plated aluminum, nickel plated aluminum 6061-$T_6$, stainless steel, as well as combinations and alloys thereof.

The support assembly 290 is partially disposed within the chamber body 262. The support assembly 290 is raised and lowered by a shaft 294 which is enclosed by bellows 293. The chamber body 262 includes a slit valve opening 261 formed in a sidewall thereof to provide access to the interior of the chamber 200. The slit valve opening 261 is selectively opened and closed to allow access to the interior of the chamber body 262 by a wafer handling robot (not shown). Wafer handling robots are well known to those with skill in the art, and any suitable robot may be used. In one embodiment, a wafer can be transported in and out of the processing chamber 200 through the slit valve opening 261 to an adjacent transfer chamber and/or load-lock chamber (not shown), or another chamber within a cluster tool. Illustrative cluster tools include but are not limited to the PRODUCER™, CENTURA™, ENDURA™, and ENDURASL™ platforms available from Applied Materials, Inc. of Santa Clara, Calif.

The chamber body 262 also includes a channel 264 formed therein for flowing a heat transfer fluid therethrough. The heat transfer fluid can be a heating fluid or a coolant and is used to control the temperature of the chamber body 262 during processing and substrate transfer. The temperature of the chamber body 262 is important to prevent unwanted condensation of the gas or byproducts on the chamber walls. Exemplary heat transfer fluids include water, ethylene glycol, or a mixture thereof. An exemplary heat transfer fluid may also include nitrogen gas or a fluorinated heat transfer fluid (e.g., Galden® or Novec®). In some embodiments, a fluorocarbon fluid is used to avoid RF power leakage through polar water molecules.

The chamber body 262 further includes a liner 273 that surrounds the support assembly 290, and is removable for servicing and cleaning. The liner 273 is preferably made of a metal such as aluminum, or a ceramic material. However, any process compatible material may be used. The liner 273 may be bead blasted to increase the adhesion of any material deposited thereon, thereby preventing flaking of material which results in contamination of the chamber 200. The liner 273 typically includes one or more apertures 265 and a pumping channel 269 formed therein that is in fluid communication with a vacuum system. The apertures 265 provide a flow path for gases into the pumping channel 269, and the pumping channel provides a flow path through the liner 273 so the gases can exit the processing chamber 200.

The vacuum system may comprise a vacuum pump 275 and a throttle valve 277 to regulate flow of gases within the processing chamber 200. The vacuum pump 275 is coupled to a vacuum port 281 disposed on the chamber body 262, and is in fluid communication with the pumping channel 269 formed within the liner 273. The vacuum pump 275 and the chamber body 262 are selectively isolated by the throttle valve 277 to regulate flow of the gases within the processing chamber 200. The terms "gas" and "gases" are used interchangeably, unless otherwise noted, and refer to one or more precursors, reactants, catalysts, carrier, purge, cleaning, combinations thereof, as well as any other fluid introduced into the chamber body 262.

The lid assembly 205 comprises a number of components stacked together. For example, the lid assembly 205 comprises a lid rim 210, gas delivery assembly 220, and a top plate 250. The lid rim 210 is designed to hold the weight of the components making up the lid assembly 205 and is coupled to an upper surface of the chamber body 262 to provide access to the internal chamber components. The gas delivery assembly 220 is coupled to an upper surface of the lid rim 210 and is arranged to make minimum thermal contact therewith. The components of the lid assembly 205 are preferably constructed of a material having a high thermal conductivity and low thermal resistance, such as an aluminum alloy with a highly finished surface, for example. Preferably, the thermal resistance of the components is less than about $5\times10^{-4}$ $m^2$ K/W.

The gas delivery assembly 220 may comprise a gas distribution plate 225 (also referred to as a faceplate or showerhead). A gas supply panel (not shown) is typically used to provide the one or more gases to the processing chamber 200. The particular gas or gases that are used depend upon the process to be performed within the processing chamber 200. For example, the typical gases include one or more precursors, reductants, catalysts, carriers, purge, cleaning, or any mixture or combination thereof. Typically, the one or more gases are introduced to the chamber 200 into the lid assembly 205 and then into the chamber body 262 through the gas delivery assembly 220. An electronically operated valve and/or flow control mechanism (not shown) may be used to control the flow of gas from the gas supply into the processing chamber 200.

In one aspect, the gas is delivered from the gas supply panel to the chamber 200 where the gas line tees into two separate gas lines which feed gases to the chamber body 262 as described above. Depending on the process, any number of gases can be delivered in this manner and can be mixed either in the chamber 200 or before they are delivered to the chamber 200.

Still referring to FIG. 2, the lid assembly 205 of some embodiments further include an electrode 240 to generate a plasma of reactive species within the lid assembly 205. In this embodiment, the electrode 240 is supported on the top plate 250 and is electrically isolated therefrom. An isolator filler ring (not shown) is disposed about a lower portion of the electrode 240 separating the electrode 240 from the top plate 250. An annular isolator (not shown) is disposed about an upper portion of the isolator filler ring and rests on an upper surface of the top plate 250. An annular insulator (not shown) is then disposed about an upper portion of the electrode 240 so that the electrode 240 is electrically isolated from the other components of the lid assembly 205. Each of these rings, the isolator filler and annular isolators can be made from aluminum oxide or any other insulative, process compatible material.

The electrode 240 is coupled to a power source 294 while the gas delivery assembly 220 is connected to ground. Accordingly, a plasma of the one or more process gases is struck in the volume formed between the electrode 240 and the gas delivery assembly 220. The plasma may also be contained within the volumes formed by blocker plates. In the absence of a blocker plate assembly, the plasma is struck and contained between the electrode 240 and the gas delivery assembly 220. In either embodiment, the plasma is well confined or contained within the lid assembly 205.

Any power source capable of activating the gases into reactive species and maintaining the plasma of reactive species may be used. For example, radio frequency (RF), direct current (DC), alternating current (AC), or microwave (MW) based power discharge techniques may be used. The activation may also be generated by a thermally based technique, a gas breakdown technique, a high intensity light source (e.g., UV energy), or exposure to an x-ray source. Alternatively, a remote activation source may be used, such as a remote plasma generator, to generate a plasma of reactive species which are then delivered into the processing chamber 200. Exemplary remote plasma generators are available from vendors such as MKS Instruments, Inc. and Advanced Energy Industries, Inc. Preferably, an RF power supply is coupled to the electrode 240.

The gas delivery assembly 220 may be heated depending on the process gases and operations to be performed within the chamber 200. In one embodiment, a heating element 270, such as a resistive heater for example, is coupled to the gas delivery assembly 220. In one embodiment, the heating element 270 is a tubular member and is pressed into an upper surface of the gas delivery assembly 220. The upper surface of the gas delivery assembly 220 includes a groove or recessed channel having a width slightly smaller than the outer diameter of the heating element 270, such that the heating element 270 is held within the groove using an interference fit.

The heating element 270 regulates the temperature of the gas delivery assembly 220 since the components of the gas delivery assembly 220, including the gas delivery assembly 220 and the blocker assembly (not shown) are each conductively coupled to one another.

Figure 3:
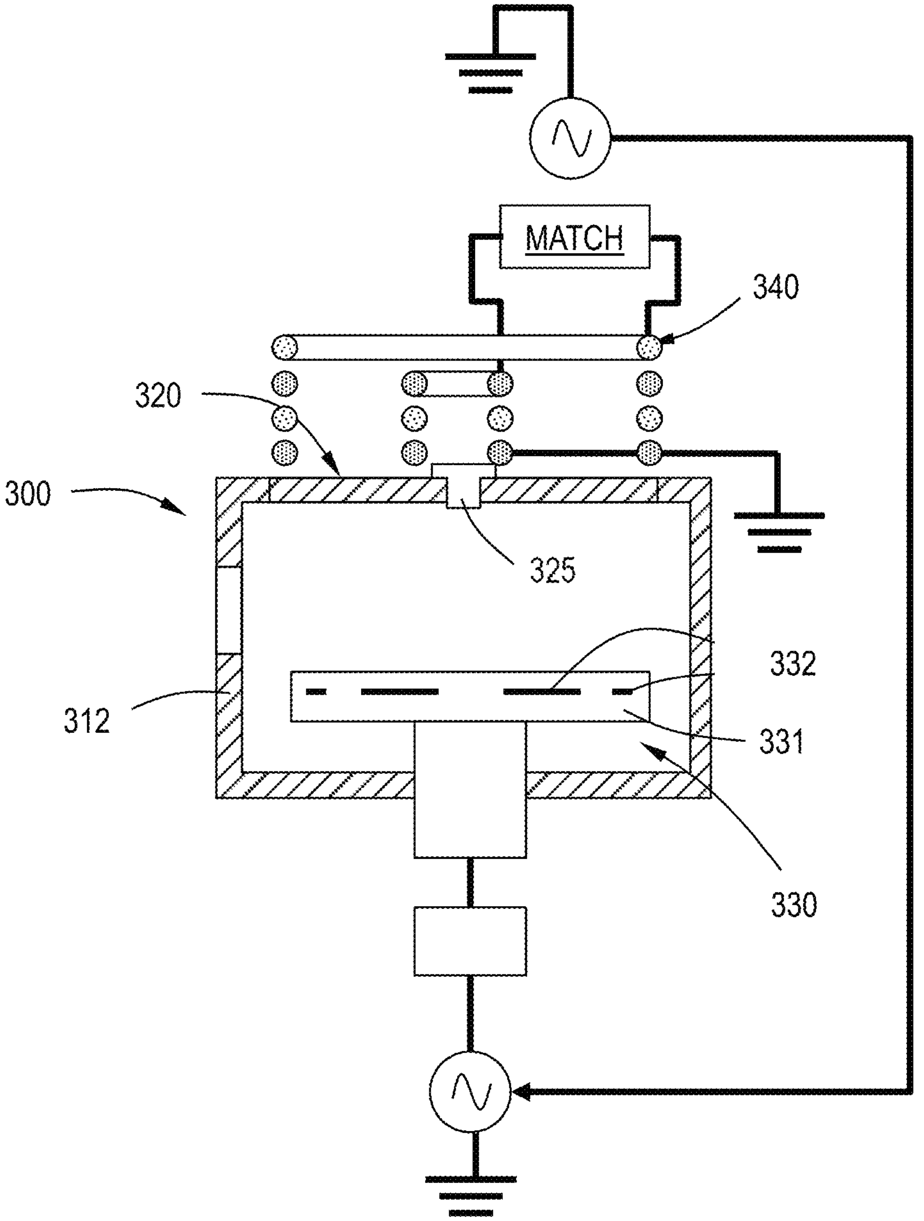
FIG. 3 illustrates a cross-sectional view of a plasma processing chamber in accordance with one or more embodiments of the disclosure.

FIG. 3 schematically illustrates a sectional view of an alternative processing chamber 300 in accordance with another embodiment of the present invention. In this embodiment, the processing chamber 300 includes a lid assembly 320 disposed at an upper end of a chamber body 312, and a support assembly 330 at least partially disposed within the chamber body 312. The processing chamber 300 also includes an inductively coupled plasma (ICP) source 340 configured to provide tunable and uniform plasma to the processing chamber 300. The processing chamber 300 and the associated hardware are preferably formed from one or more process-compatible materials, for example, aluminum, anodized aluminum, nickel plated aluminum, nickel plated aluminum 6061-$T_6$, stainless steel, as well as combinations and alloys thereof. The various elements of the processing chamber 300 and the processing parameters can generally be in accordance with those of the chamber 200 described above, except for the following primary distinctions.

The chamber 300 includes a lid assembly 320 having a gas delivery assembly that includes gas distribution nozzle 325 disposed in a center of the lid assembly 320 (e.g., as illustrated in FIG. 3). The nozzle 325 can be tunable and, thus, adjusted to control the flow of gas from the gas supply into the processing chamber 300. According to one or more embodiments, the nozzle 325 is a dual zone nozzle configured to provide center to edge neutral flux tuning, thus providing center to edge etch uniformity.

The chamber 300 further includes a support assembly 330 partially disposed within the chamber body 312. As illustrated in FIG. 3, unlike the support assembly 290 illustrated in FIG. 2, the support assembly 330 is fixed and maintained at a single processing position within the chamber body 312. According to one or more embodiments, the support assembly 330 includes a wafer support 331 having a plurality of heaters 332 disposed therein. For example, as illustrated in FIG. 3, the wafer support 331 can include one or more zones, and the plurality of heaters 332 can be disposed in each of the zones. The plurality of heaters 332 are positioned and configured to provide step-to-step temperature control and dual or multi-zone heating of the wafer support 331. For example, as illustrated in FIG. 3, the plurality of heaters 332 can be disposed in a central zone and an outer zone to provide center to edge wafer temperature tunability. During operation, the temperature of the wafer support 331 can be raised by maintaining the height of the wafer support 331 while tuning the plurality of dual/multi-zone heaters 332.

Referring to the embodiments shown in both FIGS. 2 and 3, the processing chamber 200/300 is particularly useful for performing a plasma assisted dry etching process that requires heating and cooling of the substrate surface without breaking vacuum. In one embodiment, the processing chamber 200/300 may be used to selectively remove one or more oxides on the substrate. In some embodiments, the processing chamber 200/300 may be used to perform a burn-in process.

For simplicity and ease of description, an exemplary dry etch process for removing one or more silicon oxides using an ammonia ($NH_3$) and nitrogen trifluoride ($NF_3$) gas mixture performed within the processing chamber 200 will now be described. It is believed that the processing chamber 200 is advantageous for any dry etch process that benefits from a plasma treatment in addition to both substrate heating and cooling all within a single processing environment, including an anneal process. The general process is described in connection with the processing chamber 200 configuration illustrated in FIG. 2, but would also be applicable in connection with the processing chamber 300 configuration illustrated in FIG. 3, or other comparable processing chamber configurations, as will be understood by the skilled artisan. Differences in chamber configurations, for example, a height adjustable support member 291 compared to a fixed height support member 331, different designs of lid assemblies 205/320 and gas delivery assemblies 220, and dual/multi-zone heaters 332 disposed in the support member 231 will result in slightly different process parameters as would be understood by one skilled in the art.

Referring to FIG. 2, the dry etch process begins by placing a substrate 255 (referred to above as wafer), such as a semiconductor substrate for example, into the processing chamber 200. The substrate is typically placed into the chamber body 262 through the slit valve opening 261 and disposed on the upper surface of the support member 291 (referred to above as a wafer support). The substrate 255 may be chucked to the upper surface of the support member 291. In some embodiments, the substrate 255 is chucked to the upper surface of the support member 291 by pulling a vacuum. In some embodiments, the substrate 255 is chucked to the upper surface of the support member 291 using an electrostatic chuck (not shown). The support member 291 is then lifted to a processing position within the chamber body 262 (for the embodiment illustrated in FIG. 2), if not already in a processing position. The chamber body 262 is preferably maintained at a temperature of between 50° C. and 80° C., more preferably at about 65° C. This temperature of the chamber body 262 is maintained by passing a heat transfer medium through the channel 264.

The substrate 255 is cooled below 65° C., such as between 15° C. and 50° C., by passing a heat transfer medium or coolant through fluid channels formed within the support assembly 290. In one embodiment, the substrate is maintained below room temperature. In another embodiment, the substrate is maintained at a temperature of between 22° C. and 40° C. Typically, the support member 291 is maintained below about 22° C. to reach the desired substrate temperatures specified above. To cool the support member 291, the coolant is passed through the fluid channel formed within the support assembly 290. A continuous flow of coolant is preferred to better control the temperature of the support member 291. The coolant is preferably 50 percent by volume ethylene glycol and 50 percent by volume water. Of course, any ratio of water and ethylene glycol can be used so long as the desired temperature of the substrate is maintained.

An etching gas mixture is introduced to the processing chamber 200 for selectively removing various oxides on a surface of the substrate 255. In one embodiment, ammonia and nitrogen trifluoride gases are then introduced into the processing chamber 200 to form the etching gas mixture. The amount of each gas introduced into the chamber is variable and may be adjusted to accommodate, for example, the thickness of the oxide layer to be removed, the geometry of the substrate being cleaned, the volume capacity of the plasma, the volume capacity of the chamber body 262, as well as the capabilities of the vacuum system coupled to the chamber body 262.

The ratio of the etching gas mixture may be predetermined to selectively remove various oxides on the substrate surface. In one embodiment, the ratio of ingredient in the etching gas mixture may be adjusted to uniformly remove various oxides, such as thermal oxides, deposited oxides, and/or native oxides. In one embodiment, molar ratio of ammonia to nitrogen trifluoride in the etching gas mixture may be set to uniformly remove various oxides. In one aspect, the gases are added to provide a gas mixture having at least a 1:1 molar ratio of ammonia to nitrogen trifluoride. In another aspect, the molar ratio of the gas mixture is at least about 3 to 1 (ammonia to nitrogen trifluoride). Preferably, the gases are introduced in the processing chamber 200 at a molar ratio of from 5:1 (ammonia to nitrogen trifluoride) to 30:1. More preferably, the molar ratio of the gas mixture is of from about 5 to 1 (ammonia to nitrogen trifluoride) to about 10 to 1. The molar ratio of the gas mixture may also fall between about 10:1 (ammonia to nitrogen trifluoride) and about 20:1.

A purge gas or carrier gas may also be added to the etching gas mixture. Any suitable purge/carrier gas may be used, such as argon, helium, hydrogen, nitrogen, or mixtures thereof, for example. Typically, the overall etching gas mixture is from about 0.05% to about 20% by volume of ammonia and nitrogen trifluoride. The remainder being the carrier gas. In one embodiment, the purge or carrier gas is first introduced into the chamber body 262 before the reactive gases to stabilize the pressure within the chamber body 262.

The operating pressure within the chamber body 262 can be variable. Typically, for the chamber configuration illustrated in FIG. 2, the pressure is maintained between about 500 mTorr and about 30 Torr. Preferably, the pressure is maintained between about 1 Torr and about 10 Torr. More preferably, the operating pressure within the chamber body 262 is maintained between about 3 Torr and about 6 Torr. For the chamber configuration illustrated in FIG. 3, the pressure is maintained between about 50 mTorr and about 500 mTorr, and in some embodiments can exceed 500 mTorr.

According to one or more embodiments, when using the chamber illustrated in FIG. 2, an RF power of from about 5 and about 600 Watts is applied to the electrode 240 to ignite a plasma of the gas mixture within the volumes 261, 262, and 263 contained in the gas delivery assembly 220. Preferably, the RF power is less than 100 Watts. More preferable is that the frequency at which the power is applied is very low, such as less than 100 kHz. Preferably, the frequency ranges from about 50 kHz to about 90 KHz. According to one or more embodiments, when using the chamber illustrated in FIG. 3, an RF power of from about 200 W of 13.56 MHz is applied to ignite the plasma of the gas mixture.

The plasma energy dissociates the ammonia and nitrogen trifluoride gases into reactive species that combine to form a highly reactive ammonia fluoride ($NH_4F$) compound and/or ammonium hydrogen fluoride ($NH_4F \cdot HF$) in the gas phase. These molecules then flow through the gas delivery assembly 220 via the holes 225A of the gas distribution plate 225 to react with the substrate surface to be processed. In one embodiment, the carrier gas is first introduced into the chamber 200, a plasma of the carrier gas is generated, and then the reactive gases, ammonia and nitrogen trifluoride, are added to the plasma.

Not wishing to be bound by theory, it is believed that the etchant gas, $NH_4F$ and/or $NH_4F \cdot HF$, reacts with the silicon oxide surface to form ammonium hexafluorosilicate $(NH_4)_2SiF_6$, $NH_3$, and $H_2O$ products. The $NH_3$, and $H_2O$ are vapors at processing conditions and removed from the processing chamber 200 by the vacuum pump 275. In particular, the volatile gases flow through the apertures 265 formed in the liner 273 into the pumping channel 269 before the gases exit the chamber 200 through the vacuum port 281 into the vacuum pump 275. A thin film of $(NH_4)_2SiF_6$ is left behind on the substrate surface. This reaction mechanism can be summarized as follows:

$$NF_3 + 3\ NH_3 \rightarrow NH_4F + NH_4F \cdot HF + N2$$

$$6\ NH_4F + SiO_2 \rightarrow (NH_4)_2SiF_6 + 2\ H_2O + 4\ NH_3$$

$$(NH_4)_2SiF_6 + \text{heat} \rightarrow 2\ NH_3 + 2\ HF + SiF_4$$

After the thin film is formed on the substrate surface, the support member 291 may be elevated to an anneal position in close proximity to the heated gas distribution plate 225 (referred to above as a showerhead). The heat radiated from the gas distribution plate 225 may dissociate or sublimate the thin film of $(NH_4)_2SiF_6$ into volatile $SiF_4$, $NH_3$, and HF products. These volatile products are then removed from the processing chamber 200 by the vacuum pump 275 as described above. Typically, a temperature of 75° C. or more is used to effectively sublimate and remove the thin film from the substrate 255. Preferably, a temperature of 100° C. or more is used, such as between about 115° C. and about 200° C. In alternative embodiments which use the chamber illustrated in FIG. 3, the support assembly 330 and support member 331 are fixed and, thus, not elevated or lowered in position. In these embodiments, the plurality of heaters 332 disposed in the support member 331 are tuned to adjust temperature as needed. In these embodiments, the temperature tuning is through electrical resistance heating, The thermal energy to dissociate the thin film of $(NH_4)_2SiF_6$ into its volatile components is convected or radiated by the gas distribution plate 225. As described above, the heating element 270 is directly coupled to the distribution plate 225, and is activated to heat the distribution plate 225 and the components in thermal contact therewith to a temperature between about 75° C. and 250° C. In one aspect, the distribution plate 225 is heated to a temperature of between 100° C. and 150° C., such as about 120° C.

This elevation change can be effectuated various ways. For example, the lift mechanism 295 can elevate the support member 291 toward a lower surface of the distribution plate 225. During this lifting step, the substrate 255 is secured to the support member 291, such as by the vacuum chuck or electrostatic chuck described above. Alternatively, the substrate 255 can be lifted off the support member 291 and placed in close proximity to the heated distribution plate 225 by elevating the lift pins (not shown) via the lift ring (not shown).

The distance between the upper surface of the substrate 255 having the thin film thereon and the distribution plate 225 is not critical and is a matter of routine experimentation. A person of ordinary skill in the art can easily determine the spacing required to efficiently and effectively vaporize the thin film without damaging the underlying substrate. It is believed, however, that a spacing of between about 0.254 mm (10 mils) and 5.08 mm (200 mils) is effective.

Once the film has been removed from the substrate, the processing chamber 200 is purged and evacuated. The processed substrate is then removed from the chamber body 262 by lowering the support member 291 (in the FIG. 2 chamber) to the transfer position, de-chucking the substrate, and transferring the substrate through the slit valve opening 261.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. An etching method comprising:

individually exposing a plurality of wafers to a plasma etching environment at a first temperature in a plasma etch chamber without cleaning or conditioning the chamber between the wafers;

cleaning the chamber in an absence of a wafer while maintaining a wafer support within the chamber at a second temperature greater than the first temperature; and exposing a chamber process kit and the wafer support to a cleaning plasma, an etching plasma, and a treatment plasma sequentially with intervening purges of the chamber, wherein the method reduces a decrease in etching efficiency for a first wafer processed after cleaning the plasma etch chamber.

2. The method of claim 1, wherein the plurality of wafers comprises greater than or equal to 5 wafers.

3. The method of claim 1, wherein the plurality of wafers comprises greater than or equal to 100 wafers.

4. The method of claim 1, wherein the plasma etching environment is formed by igniting a plasma of $NF_3$ and $NH_3$.

5. The method of claim 4, wherein the plasma etching environment is formed with a low power in a range of 100 W to 2000 W.

6. The method of claim 1, wherein the plasma etching environment is provided by a remotely generated plasma.

7. The method of claim 1, wherein the plasma etching environment is provided by a direct, inductively coupled plasma.

8. The method of claim 1, further comprising heating each wafer to a third temperature after the exposure to the plasma etching environment.

9. The method of claim 8, wherein the third temperature is greater than or equal to 85° C.

10. The method of claim 1, wherein the first temperature is in a range of 20° C. to 40° C.

11. The method of claim 1, wherein the plasma etching environment removes exposed native oxide layers from the plurality of wafers.

12. The method of claim 1, wherein the cleaning plasma comprises argon and oxygen ($O_2$).

13. The method of claim 1, wherein the etching plasma is formed from plasma gases used in the plasma etching environment.

14. The method of claim 1, wherein the etching plasma comprises $NF_3$ and $NH_3$.

15. The method of claim 1, wherein the treatment plasma is formed from a gas comprising ammonia.

16. The method of claim 1, wherein the second temperature is greater than or equal to 80° C.

17. A method of etching a plurality of wafers, the method comprising:

etching a first set of at least two silicon wafers within a plasma etch chamber, each silicon wafer having a native oxide on an exposed surface of the silicon wafer, each wafer individually exposed to an etching plasma environment at a first temperature in a range of 20° C. to 40° C. and heated to a third temperature greater than or equal to 85° C. to remove the native oxide, the etching plasma environment formed from a plasma gas comprising $NF_3$ and $NH_3$;

cleaning the chamber by exposing a chamber process kit and a wafer support to a cleaning plasma comprising Ar and $O_2$, a remote etching plasma comprising $NF_3$ and $NH_3$ and a treatment plasma comprising NHs in an absence of a wafer, the wafer support being maintained at a second temperature greater than or equal to 85° C., the chamber only being cleaned after etching the first set of at least two silicon wafers; and repeating the etching and the cleaning with a second set of at least two wafers, wherein the method reduces a decrease in etching efficiency for a first wafer processed after cleaning the plasma etch chamber.

* * * * *